US006002196A

United States Patent [19]

Sumita et al.

[11] Patent Number: 6,002,196

[45] Date of Patent: Dec. 14, 1999

[54] PIEZOELECTRIC DISPERSION TYPE ORGANIC DAMPING COMPOSITE

[75] Inventors: Masao Sumita, 2-4-13, Teraominami, Ayase-shi, Kanagawa; Tadao Tokushima, Hamamatsu, both of Japan

[73] Assignee: Masao Sumita, Ayase, Japan

[21] Appl. No.: 08/942,027

[22] Filed: Oct. 1, 1997

[30] Foreign Application Priority Data

Jan. 10, 1997 [JP] Japan .................................... 9-003196
Jun. 10, 1997 [JP] Japan .................................... 9-169423

[51] Int. Cl.[6] ...................................................... H01L 41/08

[52] U.S. Cl. ............................................ 310/326; 310/311

[58] Field of Search ...................................... 310/326, 311

[56] References Cited

U.S. PATENT DOCUMENTS 5,309,767 5/1994 Parmar et al. ............................ 73/705
5,667,720 9/1997 Onishi et al. ...................... 252/299.01

*Primary Examiner*—Thomas M. Dougherty
*Attorney, Agent, or Firm*—Oblon, Spivak, McClelland, Maier & Neustadt, P.C.

[57] ABSTRACT

A damping material having a loss factor tan $\delta \geqq 1$ and a small strain amplitude dependence, which is formed by dispersing an organic series dielectric or ferroelectric material in a non-dielectric polymer to have an acicular form wherein the acicular ratio is 5 or more, and the diameter of the acicular dielectric or ferroelectric material is 20 $\mu$m or less when it takes a circular acicular form, or a side in cross section of the acicular dielectric or ferroelectric material is 20 $\mu$m or less when it takes a rectangular acicular form. The volume ratio of the dielectric or the ferroelectric material to the non-dielectric polymer is preferably 0.3 to 0.7.

6 Claims, 10 Drawing Sheets

SEM PICTURE 1

SEM PICTURE 2 tan δ: LARGE
DIELECTRIC
MATERIAL:
THIN

SEM PICTURE 2 tan δ: SMALL
DIELECTRIC
MATERIAL:
THICK

PIEZOELECTRIC DISPERSION TYPE ORGANIC DAMPING COMPOSITE

BACKGROUND OF THE INVENTION

1. Field of the Invention

The present invention relates to a damping material for attenuating vibrations by converting a vibrational energy to an electric energy. In particular, it relates to a piezoelectric dispersion type organic damping composite utilized for damping an apparatus or a device, absorbing noises and so on.

2. Discussion of Background

A conventional damping material is of such a type that a scale-like inorganic material such as mica is dispersed in a polymer matrix so that a vibrational energy is absorbed by mutual friction of the dispersed material, which is caused by vibrations, or of such a type that a magnetic interaction is utilized, in addition to the mutual friction, with use of powder of a magnetic material such as ferrite or the like. In either case of the conventional damping techniques, the loss factor tan δ is at most about 0.5.

Further, there has been proposed a technique of converting a vibrational energy to an electric energy by using powder of an inorganic ceramic piezoelectric as a dispersing material. In the proposed technique, however, the elastic modulus of the ceramics is far different from that of a polymer material whereby the effect of transmitting a kinetic energy is low: the anti-polarization factor is large as 0.3 because the shape of powdery particles is spherical to thereby reduce a strain-electric-conversion effect, and the loss factor tan δ is 0.5 or less.

As another proposal, a polymer in a gel state as a dispersing material is dispersed in a polymer matrix in an attempt that a vibrational energy is absorbed due to the friction between the gel-like polymer and the polymer matrix. However, the loss factor does not exceed 1. In particular, the damping material by the proposed technique can not be used as a structural material because it does not have a sufficient strength. In the above-mentioned conventional damping materials, the strain amplitude dependence is large since the kinetic interaction between the polymer matrix and the dispersing material is mainly utilized. Accordingly, although these damping materials provided a certain effect when the amplitude of vibrations was large ranging $10^{-3}$–$10^{-4}$, there exhibited less performance in a range of strain amplitude of $10^{-7}$ for the purpose of sound absorption and insulation.

SUMMARY OF THE INVENTION

It is an object of the present invention to provide a damping material having a sufficient hardness usable as a structural material; having a loss factor tan δ of 1 or more, and having a smaller strain amplitude dependence.

In accordance with the present invention, there is provided a piezoelectric dispersion type organic damping composite comprising an organic dielectric or ferroelectric material which is dispersed in a non-dielectric polymer.

Journal of Sound and Vibration (1991) of N. W. HAGOOD et al discloses that when an impedance element (L) is connected to a piezoelectric ceramic to cause a resonance in association with the capacitance (C) of the ceramics, a very large loss factor is obtainable.

The inventors of this application disclose that when the above-mentioned technique is applied to a piezoelectric film of PVDF and cyanoethylated hydroxyethyl cellulose, a large loss factor and a large sound insulating effect can be obtained at or near the resonance frequency (Polymer Academy, Spring Session at Yokohama in 1994).

The effect of an internal loss due to an electric loss in a piezoelectric material is shown in formula 1. From formula 1, it can theoretically be anticipated that in an electromechanically resonating state, the electric loss assumes a very large value because the denominator of the formula is nearly zero and it does not depend on the electromechanical conversion constant K of a material used. The inventors has described that the anticipation is correct in an experiment using PVDF (K=0.1) and cyanoethylated hydroxycellulose (K=0.03–0.01).

$$\text{Electric loss} = \frac{K_{ij}^2\delta^2(\delta^2 rg)}{(\delta^2 - g^2)^2 + (\delta^2 rg)^2 - K_{ij}^2\delta^2(\delta^2 - g^2)} \qquad \text{formula 1}$$

where $K_{ij}$: Electromechanical coupling constant, δ: generic resonance frequency ratio (electrical and mechanical), R: generic resistance, g: real number portion of γ=generic electrical frequency, γ: generic frequency, and wn: resonance frequency of system (at the time of grounding the terminal)

In the application of this technique to a wall of a building, there arose the problem as follows. In an electric circuit comprising a circuit network of L, C and R, effects by L and C are canceled in a resonance state. Accordingly, the optimum resistance R in the circuit network to provide the maximum electric loss under such condition should satisfy the following formula 2:

$$wCR = \frac{\sqrt{2}\,K}{1 + K^2} \qquad \text{formula 2}$$

where C: capacitance of piezoelectric material, R: the total resistance of a circuit network including the resistance of electrodes for piezoelectric material, K: electromechanical coupling constant of piezoelectric material PVDF K=0.1, and w: resonance frequency When a PVDF film of 30 μm thick is used and sound measurement is conducted with use of a small sound reverberation box, the optimum resistance is 250Ω since the surface area of the film used is 30×40 cm. On the other hand, the optimum resistance is 0.25Ω in a case of using a film of 200×100 cm which is used for ordinary doors. Accordingly, in a practically used circuit structure, the resistance is too small to practically use.

On the contrary, when a piezoelectric material having a smaller size is used, the optimum resistance becomes large as $10^6$Ω in a case of a film size of 40×2 mm. If a material having a piezoelectric property can be dispersed in a level of micron size in a non-piezoelectric material, the optimum resistance is very high ranging $10^{13}$–$10^{18}$Ω. Since the inherent resistance of ordinary used polymer materials fall in this region, it can be considered that use of the ordinary polymer materials unnecessitates a special circuit structure, for example, electrodes and lead wires.

Further, the inventors have described in a magazine of Polymer Academy, vol 46, 1997 that with use of an equation of kinetics of a material and material constants of a linear piezoelectric, a equivalent inductance (L) component of dispersed material is expressed by formula 3:

$$L = \frac{M}{{d_{31}}^2 Y^2 w^2} \quad \text{formula 3}$$

where M: mass of piezoelectric material, Y: Young's modulus, D: piezoelectric d constant, and w: width of piezoelectric material.

Namely, when the width of the material is made small and an organic dielectric material (having a Young's modulus two orders smaller than ceramics) is used, a large inductance component can be obtained, and it is expected that an exterior inductance shown in the HAGOOD's formula is needless.

Further, when the piezoelectric material is dispersed in a fine acicular form, it can be expected that a dielectric material having a smaller piezoelectric d constant is usable as a piezoelectric material as is analogized from the effect of anisotropy of configuration of a magnetic material.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
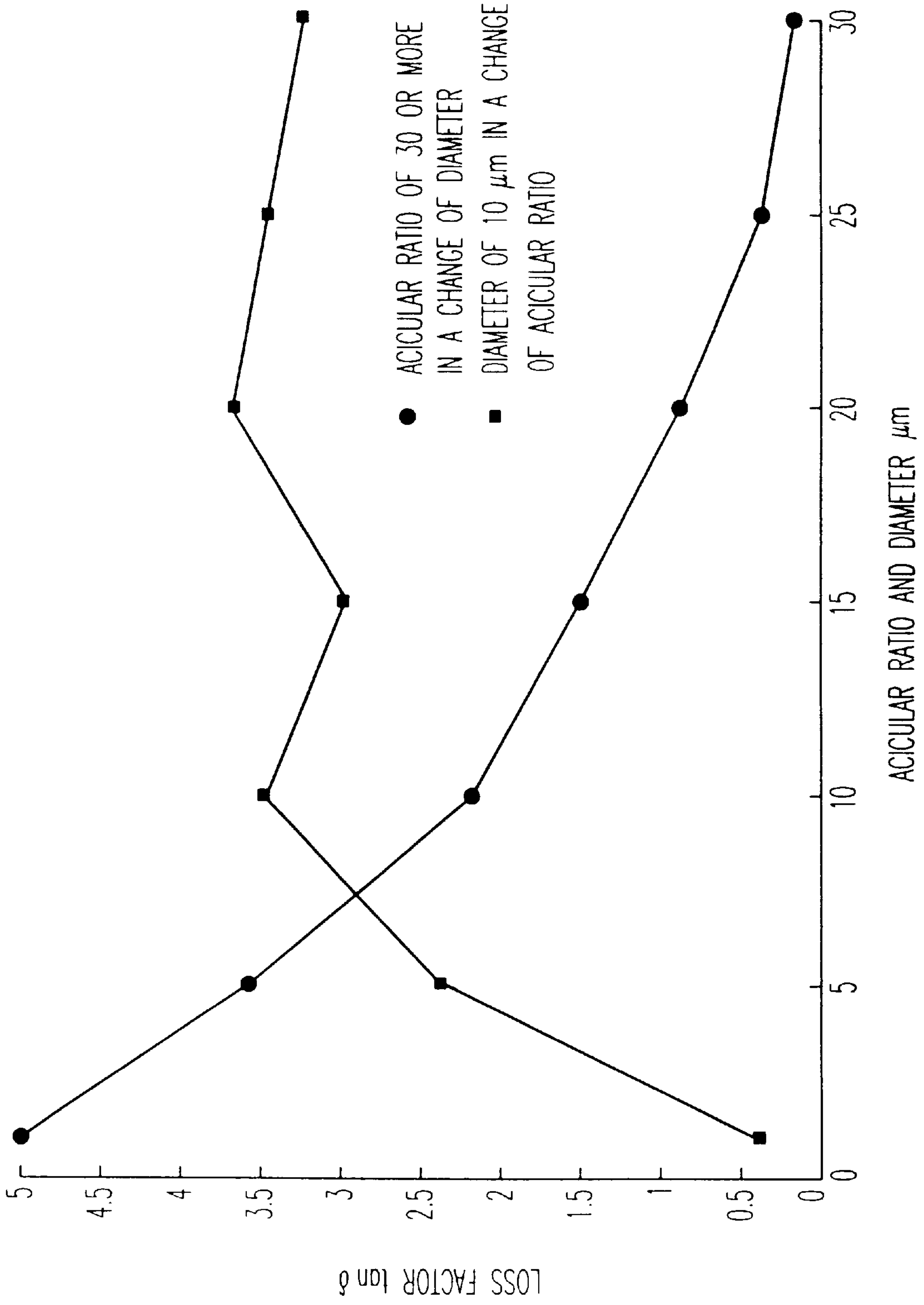
FIG. 1 is a graph showing the dependence of the loss factor on the diameter (or the length of a side) and the acicular ratio of a dielectric material.

The present invention has been achieved based on the above-mentioned philosophy, and the above-mentioned problem has been solved by absorbing a vibrational energy by utilizing a strain-electric-conversion effect of an organic series dielectric or ferroelectric material which is dispersed in a polymer matrix. An itemized explanation will be made in the following.

1) Improvement of transmission efficiency of a kinetic vibrational energy

An organic series dielectric or ferroelectric material having an elastic modulus which is close to the elastic modulus of a matrix polymer was used as a dispersing material. As a result, efficiency of transmitting a vibrational energy to the dielectric material could be increased.

2) Improvement of transmission efficiency of a vibrational energy to an electric energy The shape of the dielectric or the ferroelectric material dispersed in the matrix was rendered to be an acicular form. As a result, the anti-polarization factor became small; influence of an anti-electric field due to electric charges produced by a strain was reduced, and the transmission efficiency to electricity was increased. In particular, when the acicular ratio is maintained to be 5 or more, the anti-polarization factor becomes 0.04 or less, which increases the transmission efficiency.

When the shape of the dispersed material in an acicular form is in a cylindrical shape, the diameter should be 20 $\mu$m or less and when it is in a rectangular prism form, the length of a shorter one between two sides in cross section should be 20 $\mu$m or less, whereby the electric coercive force is increased, the area of the hysteresis loss is increased, and the energy dissipation loss is increased.

Further, the volume ratio of the dispersed dielectric or ferroelectric material to the matrix was determined in a range of 0.3 to 0.7, whereby reduction of the electric coercive force by the interaction due to interference of the dispersed material and effect by electric charges by an increase of the charging rate of the dielectric were well balanced to thereby increase the damping performance of the material. In this specification, the dielectric or ferroelectric material means a substance which is capable of causing electric polarization but does not produce a direct current when a static electric field is applied or no electric field is applied. It also include a substance indicating a dielectric characteristic in an acicular form although such substance is not generally belong a dielectric material.

Description will be made in the following on a method of producing a damping material having a high loss factor tan δ of 1 to 15 by applying the above-mentioned mechanism to a polymer composite material.

Regarding the first item concerning the energy transmission efficiency, the elastic modulus and the density of ceramics such as PZT are larger than those of a polymer material constituting the matrix. Accordingly, the acoustic impedance is different from each other, and it is difficult to transmit a strain produced in the matrix to the piezoelectric of ceramics. Accordingly, it is understood that an organic dielectric-polymer dispersion type damping material is excellent in the point of transmission efficiency.

Regarding the item 2 concerning the effect obtained by specifying the configuration of the dispersing material, when the dielectric material in an acicular form is considered to be a magnetic material and a equation of magnetic coercive force expressed by a curling model of a magnetic material in an acicular form, described below, is used, the magnetic coercive force is increased unless the magnetic material becomes a super palla-magnetizing material (Fe 100 Å) as the dispersing material of acicular form becomes thinner:

$$Hc = \frac{1}{2\mu} * I * 1.08\left(\frac{R_o}{R}\right)^2 \quad \text{formula 4}$$

where I: magnetization rate, R: particle diameter, and $R_0$: diameter determined by an exchange interaction When a magnetic material does not have a certain mass, the direction of magnetization can not be maintained because of thermal electron spin relaxation. However, such requirement is relaxed to a molecule size in a case of a dielectric material. The theory on a magnetic material may be appropriately applicable to a dielectric material since they have many analogous phenomena.

When the dielectric material is thin, the electric coercive force is large, and the D-E area of the hysteresis is increased whereby an energy loss is increased. A dispersing material of particulate form, if particles are connected as a whole, can be considered to be the same as the dispersing material of acicular form. When the acicular ratio exceeds 5 so that the dispersing material is in an elongated form, the anti-polarization coefficient becomes small. As a result, influence of an anti-electric field due to voluntary polarization becomes small. Accordingly, the dielectric material of acicular form can influence an electric field in proportion to the electric charges to the dielectric material around there, and an energy loss based on the electric charges produced by a strain can be increased.

Influence of a polarization moment of the dielectric material to an energy loss will be able to expect as well since the magnetic coercive force is increased in proportion to the magnetization rate in the above-mentioned formula.

A theoretical equation of a piezoelectric material shows that use of a dispersed dielectric material at or near a mechanical-electric resonance frequency remarkably increases the loss. With respect to effect based on a volume of a dielectric material, a Neel's formula which indicates the relation between packing density and magnetic coercive force of a magnetic material in non-magnetic matrix is applicable:

$$Hc(P)=(1-P)*Hc(O)I(P)=P*I$$

where Hc: magnetic coercive force, I: magnetization rate, and P: packing density The optimum value of the packing density is around 50%. When the volume ratio of the dielectric exceeds 0.7, the electric coercive force decreases because of the interaction of the dielectric acicular materials. On the other hand, when the volume ratio is less than 0.3, the energy loss decreases because although the electric coercive force of individual pieces of dielectric material is large, the absolute electric quantity is small.

The above-mentioned phenomenon of the dielectric dispersion type damping material would be the same as the phenomenon in a magnet material (tradename: LODOX, manufactured by GE) which is produced by dispersing a magnetic material of acicular form prepared by plating in mercury into a non-magnetized matrix.

Now, the present invention will be described in detail with reference to Examples. However; it should be understood that the present invention is by no means restricted by such specific Examples.

EXAMPLE 1

Preparation of samples

Polyethylene chloride (molecular weight: (500–1,000)× $10^2$) as a matrix and N,N-dicyclohexyl-2-benzothiazylsulfenamide as a dielectric dispersing material were measured in predetermined amounts, and they were mixed at a temperature of 120–150° C. for 10 minutes. The mixture was press-molded under a pressure of 100–200 $kg.cm^2$ to form sheets of 0.1–0.3 mm thick.

The sheets were annealed at 80–100° C. for 30 minutes to prepare various kinds of samples which were different in compound ratio and mixing condition. The samples were cut in the size of 40×2×0.1 mm for measurement. The dielectric material is dispersed in an acicular form in the course of mixing and recrystallization since the melting point of N,N-dicyclohexyl-2-benzothiazylsulfenamide is around 80° C.

When NYLON 11 or a liquid crystal polymer (tradename: Vectran) which can be processed into a fiber form is used for the dielectric material, it can be dispersed by cutting to have a predetermined dimensional ratio after it has been processed into thin fibers.

Sometimes, the electric conductivity of the polymer matrix is insufficient depending on the diameter of fibers and the dimensional ratio. In this case, carbon powder or carbon fibers can be incorporated to compensate the electric conductivity. Further, when a dielectric material to be dispersed is of a compound having a relatively low molecular weight, has a low melting point and is apt to bleed out from the polymer matrix, a filler of inorganic or organic material may be used in either state that the dielectric material is bonded to the surface of the filler or it is dispersed in the filler whereby a predetermined shape can be maintained.

In use of N,N-dicyclohexyl-benzothiazolsulfenamide and polyethylene chloride, the dielectric material can be used in a state that it is absorbed in the surface of cellulose fibers, polyester wiskers or the like to thereby improve durability.

EXAMPLE 2

Polyethylene chloride was used as a polymer matrix, and fibers of NYLON 11 of 25 μmϕ and an acicular ratio of 5 or more were added as a dielectric material to polyethylene chloride at a volume ratio of 10%. The materials were mixed under the same temperature condition and pressed under the same pressure condition as in Example 1 to prepare sheets.

EXAMPLE 3

Damping sheets were prepared under the same conditions as in Example 1 except that polymeric cellulose fibers as a matrix and wood pulp fibers of 100 phr (No. 1), liquid crystal polymer fibers (tradename: Vectran) of 30 μm in diameter, 100 phr (No. 2) and a mixture of No. 2 and carbon powder of 10% wtN, as a dispersing material were used.

The loss factor tan δ was measured with a tester "VIBRON M-2" (manufactured by Toyo Baldwin K.K.). The packing density and the acicular ratio were measured with a scanning electron microscope (SEM) with an energy dispersion type X-ray analyzer (EDX).

Dependence of loss factor on acicular size and ratio

Figure 5:
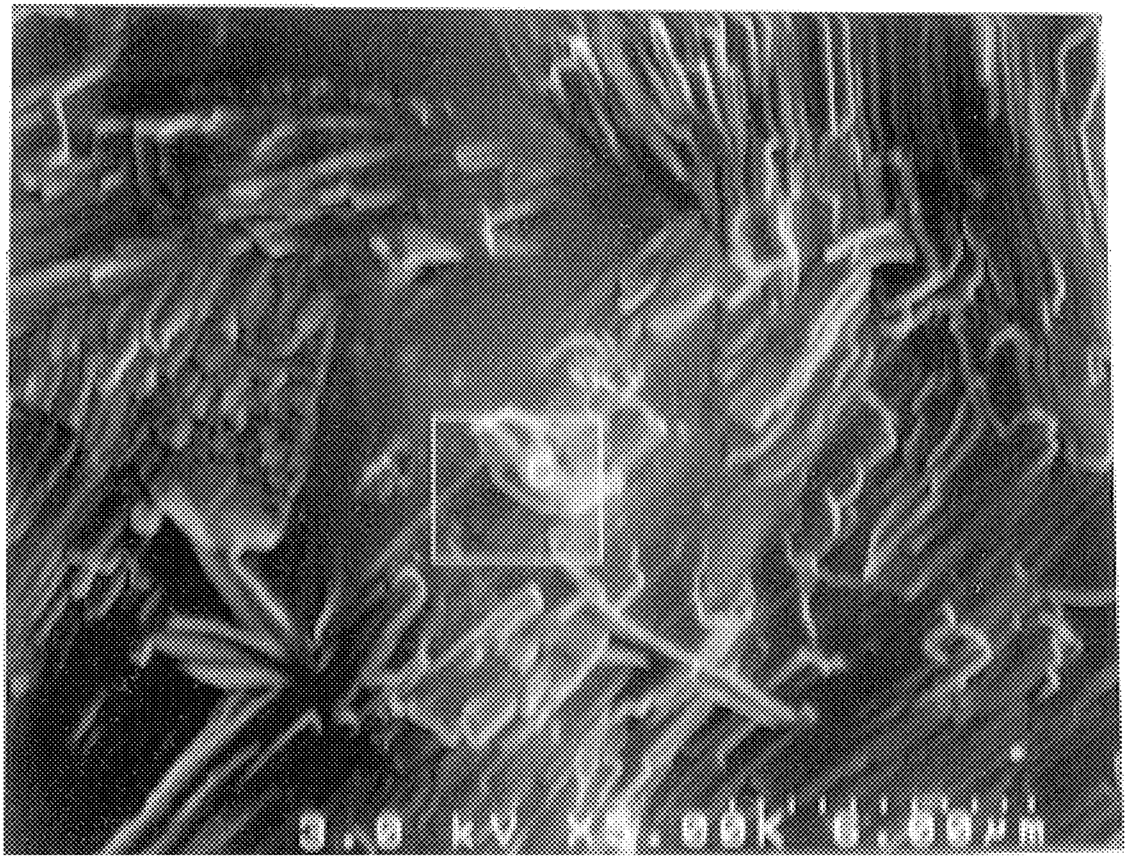
FIG. 5 is a SEM picture showing an example of a portion to which analysis is conducted.
Figure 6:
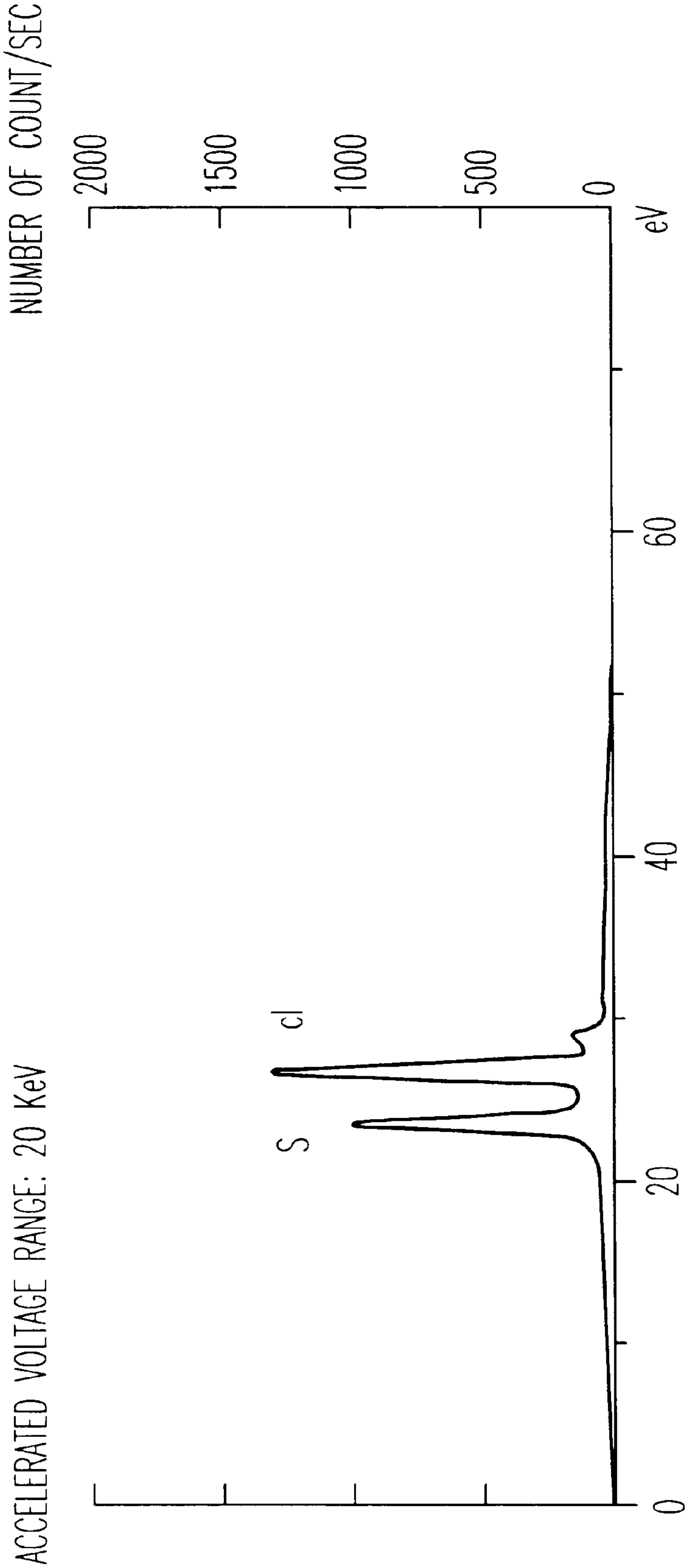
FIG. 6 is a graph showing a result of the analysis to a section C and a section S in the SEM picture.
Figure 7:
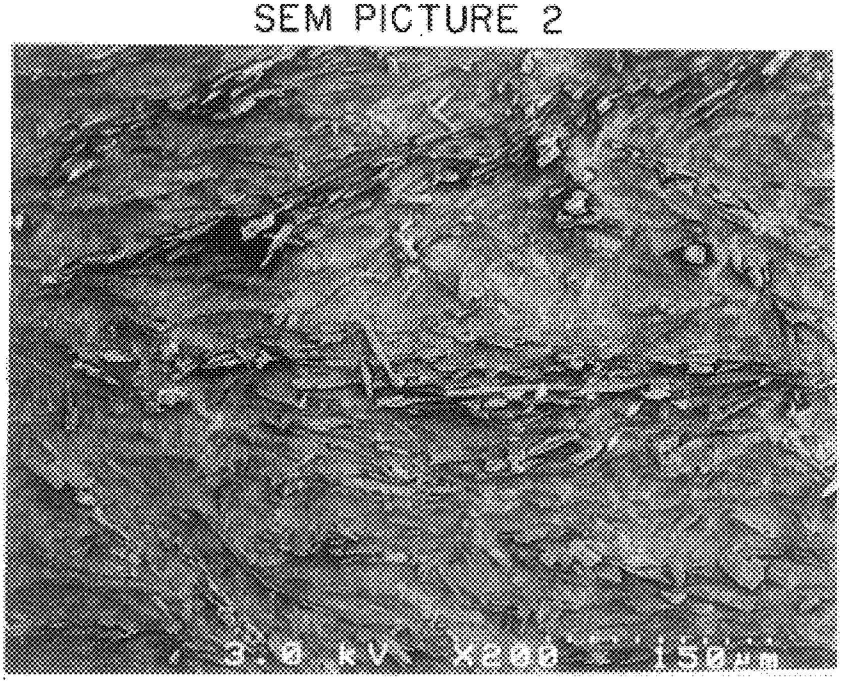
FIG. 7 is a SEM picture showing an example of acicular ratio in a portion to which analysis is conducted.
Figure 8:
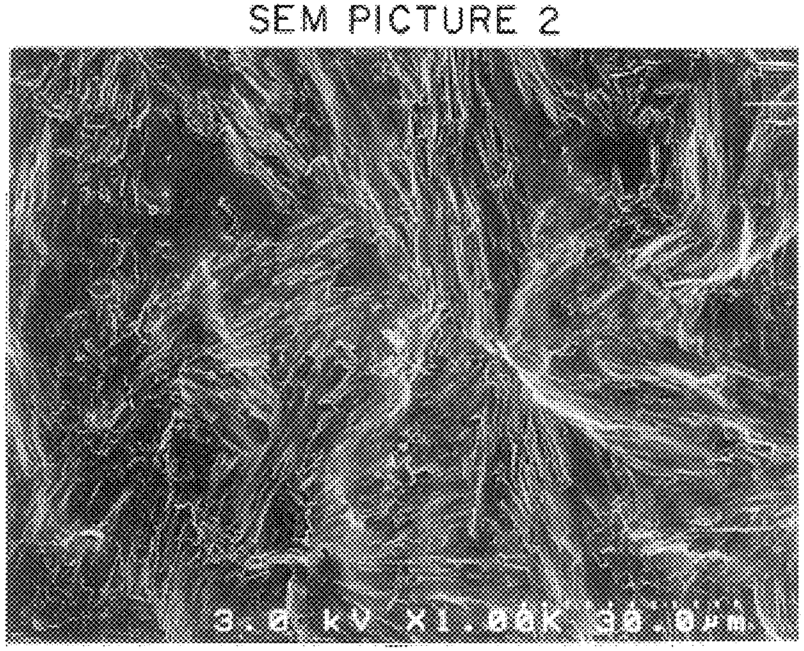
FIG. 8 is a SEM picture showing another example of acicular ratio in a portion to which analysis is conducted.

Various kinds of samples having different acicular ratios were prepared by changing temperature during the mixing of mixtures and a depressing rate with a roller, and the loss factor of these samples was measured at a frequency in a range of 35–110 Hz. FIG. 1 shows data as a result of the measurement of the loss factor at 110 Hz, and FIGS. 5, 7 and 8 show SEM pictures as a result of the measurement of the acicular ratio. FIG. 7 shows an example that the dielectric material is made thin and the loss factor tan δ is large, and FIG. 8 shows an example that the dielectric material is thick and the loss factor tan δ is small.

It is understood that from the data that the loss factor of the dielectric material having an acicular ratio of 5 or more and a diameter in cross-section of 20 μm or less, is large.

Dependence of loss factor on packing ratio of dielectric material

Figure 2:
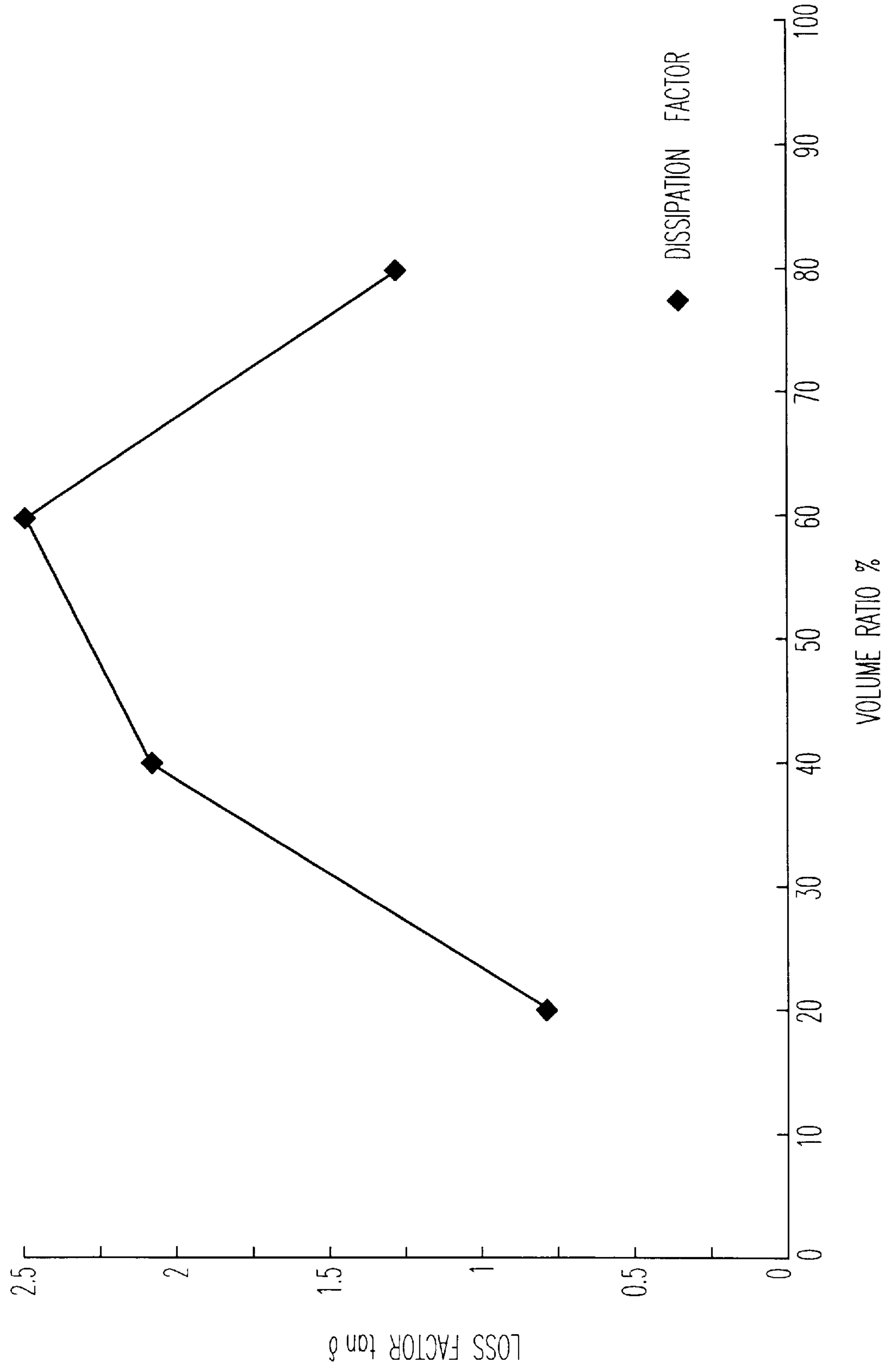
FIG. 2 is a graph showing the dependence of the loss factor on a fraction ratio of a dielectric material.

Various kinds of samples were prepared by changing the relative ratio of materials. Measurement was conducted with the EDX on a sulfur content and a chlorine content at predetermined portions of the samples to obtain a packing ratio of each of the samples. The acicular ratio of the samples was about 30 and the diameter was 10 μm. The loss factor at 35–110 Hz was measured with the above-mentioned tester. FIG. 2 shows data at 110 Hz. It is found that a value in a packing ratio of 50%±20% is good.

Dependence of strain amplitude on loss factor

Figure 3:
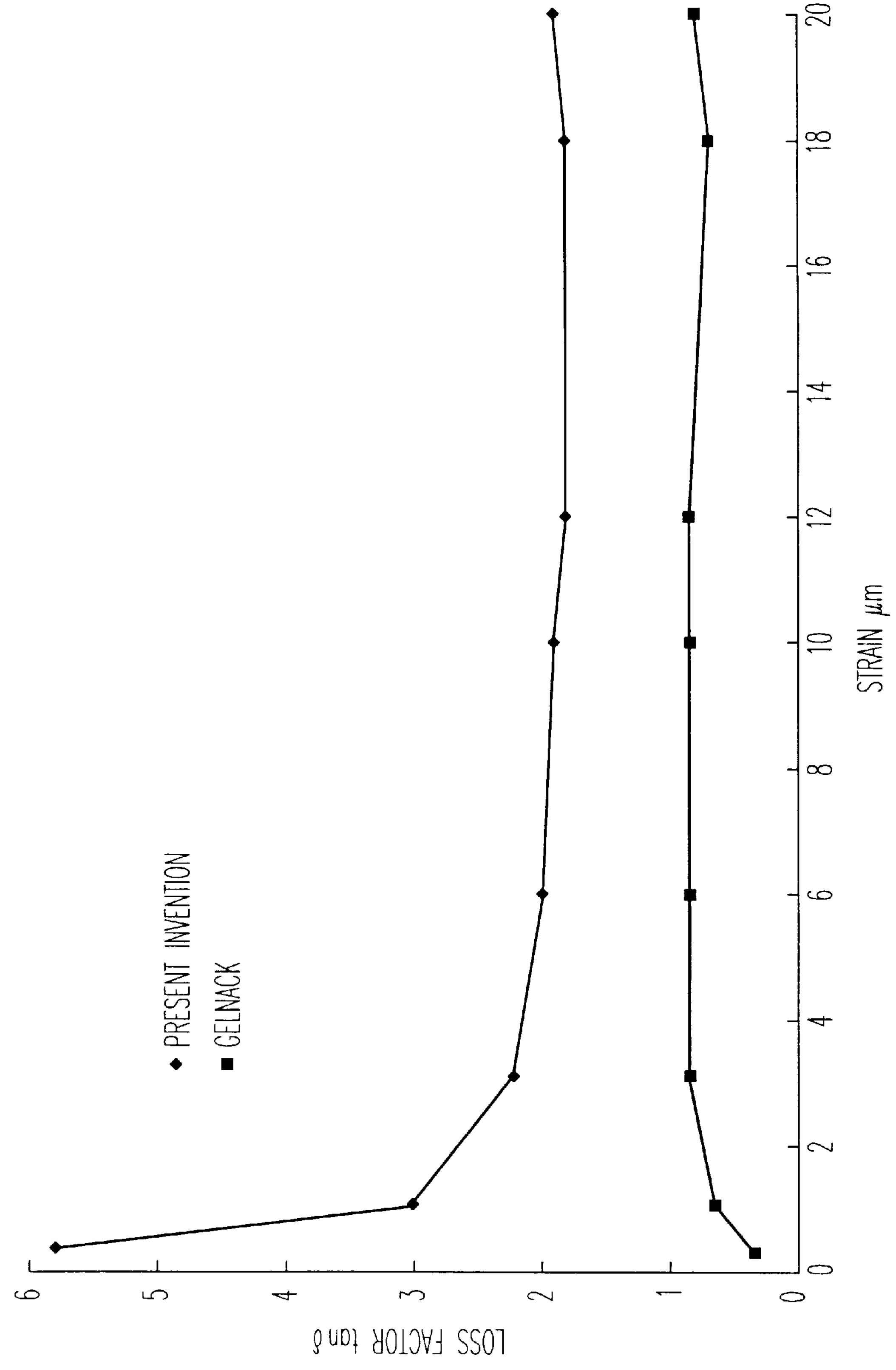
FIG. 3 is a graph showing the strain amplitude dependences of a dispersion type piezoelectric damping material and an internal friction type damping material.

FIG. 3 shows the dependence of the amplitude on the loss factor of the damping material of the present invention in comparison with an internal friction type damping material in which gel is used as a dispersing material (tradename: Gelnack, manufactured by K.K. Nippon Automation). The product according to the present invention shows that there is no reduction of loss factor in a range of small amplitude; the mechanism of absorbing a vibrational energy is different from the ordinary mechanism, and is excellent in controlling acoustic vibrations which has strain ratio $10^{-5}$–$10^{-8}$.

Dependence of temperature on loss factor

Figure 4:
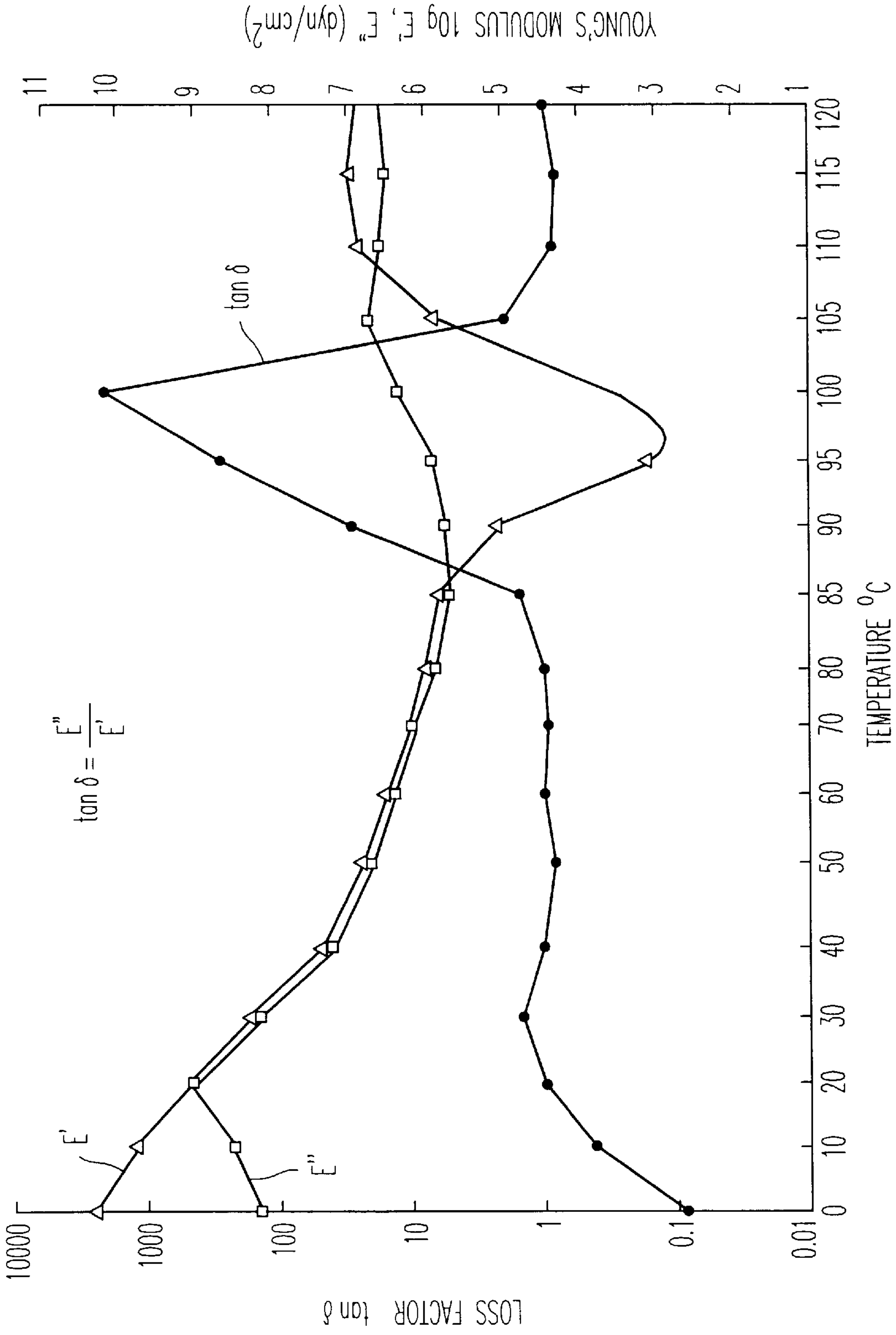
FIG. 4 is a graph showing the resonance characteristics of loss factors.

FIG. 4 shows the temperature dependence on the loss factor of a damping composite having a volume ratio of 50%, an acicular ratio of 30 and a diameter of 16 μm at 110 Hz. In FIG. 4, E' and E" respectively represent Young's moduli at each temperature wherein E' represents a real number part and E" represents an imaginary number part. A symbol tan δ indicates E"/E'. The sample resonates at or around 100° C. and indicates a large value of loss factor of 3,000 or more. The resonance temperature and the frequency can be changed by suitably selecting the organic dielectric material and the polymer material for the matrix. The loss factor of such large value has not been able to obtain with the material other than liquid, and the loss factor could not be obtained with a solid state damping material of a Young's modulus of $10^6$ dyn.cm$^2$.

The above-mentioned effect is obtainable in the case of using the above-mentioned materials as the organic dielectric material and the polymer for matrix. It is understood that a wide selection is possible by suitable combining materials and adjusting conditions of use.

Sound absorption rate of vertically entering sound

Figure 9:
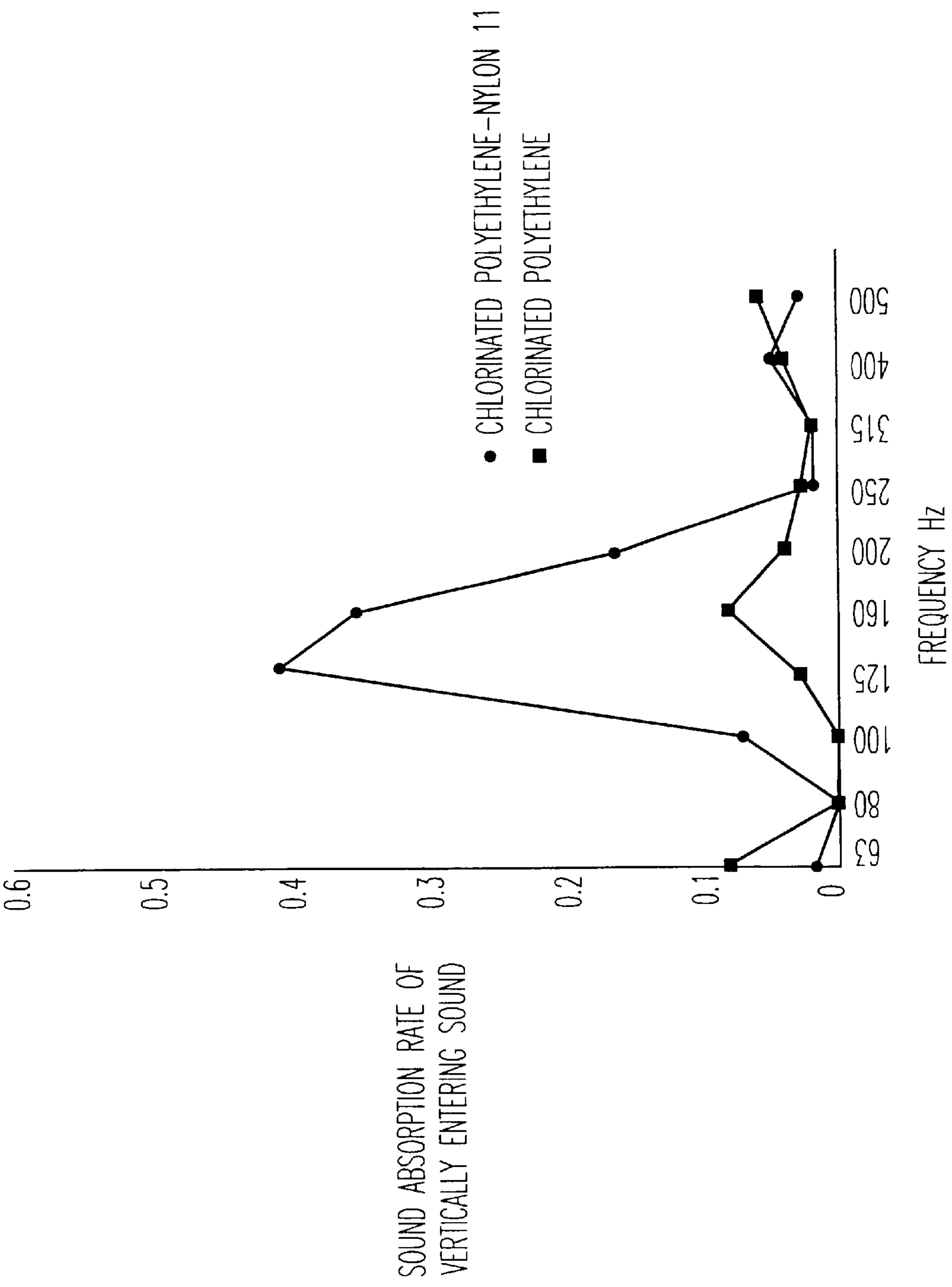
FIG. 9 is a graph showing a result of the measurement of absorption rate of vertically entering sounds in a case that a dielectric material is made of fibers.

By using the damping sheets obtained in Example 2, the sound absorption rate was measured on vertically entering sounds according to a testing method JIS A1405. As shown in FIG. 9, an excellent result was obtained in a range of a frequency of 100–230 Hz.

Increase rate of internal loss

Figure 10:
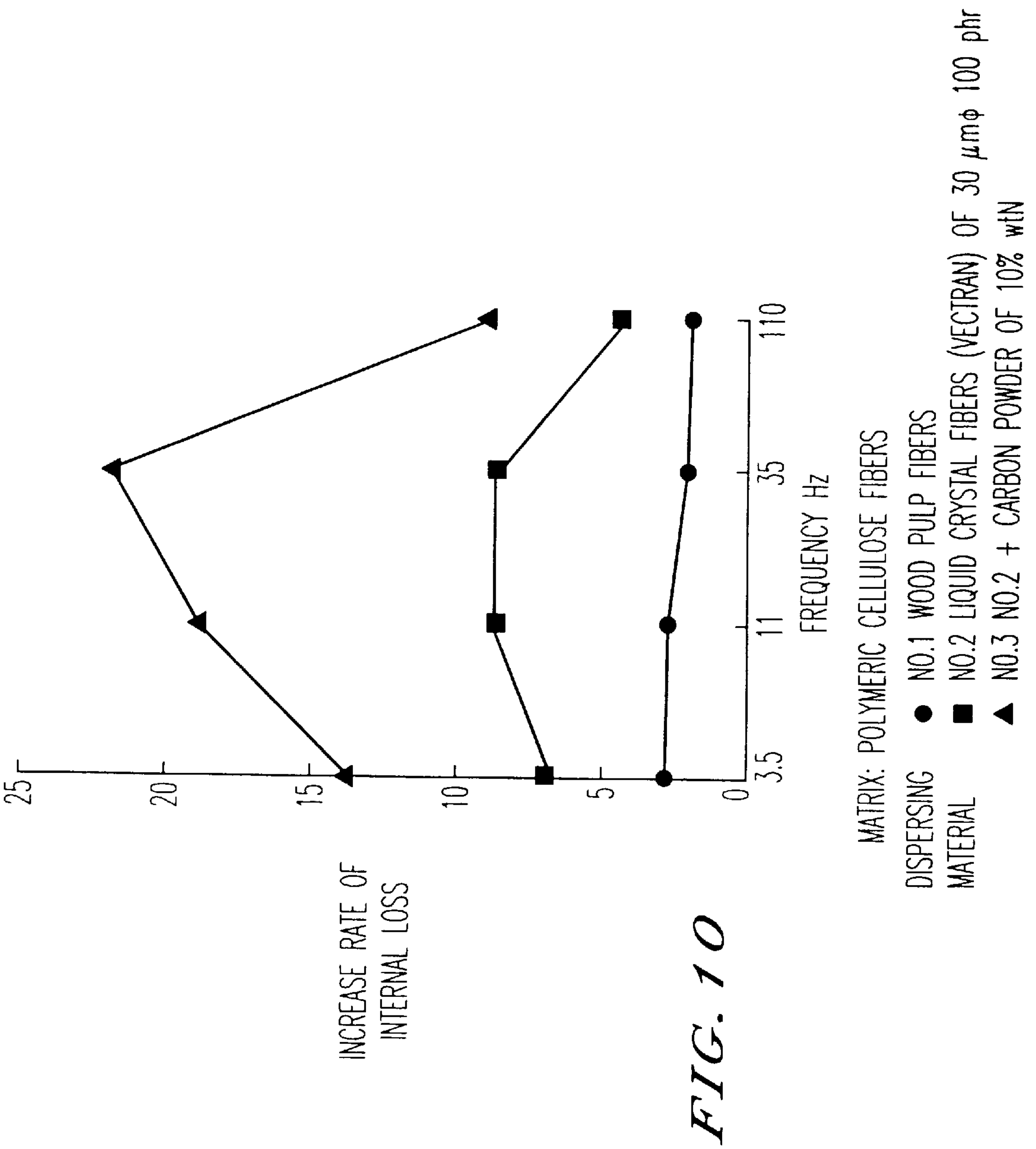
FIG. 10 is a graph showing an increase of internal loss in a case that polymeric cellulose fibers are used for a matrix.

An increase rate of internal loss of the damping sheets obtained in Example 3 was measured wherein the material of high polymeric cellulose fibers was taken as standard. A result is shown in FIG. 10.

Test of deterioration rate

The damping materials obtained by the above-mentioned Examples were measured to obtain respective deterioration rates at the date of 60 days after. A result is shown in FIG. 11.

Figure 11:
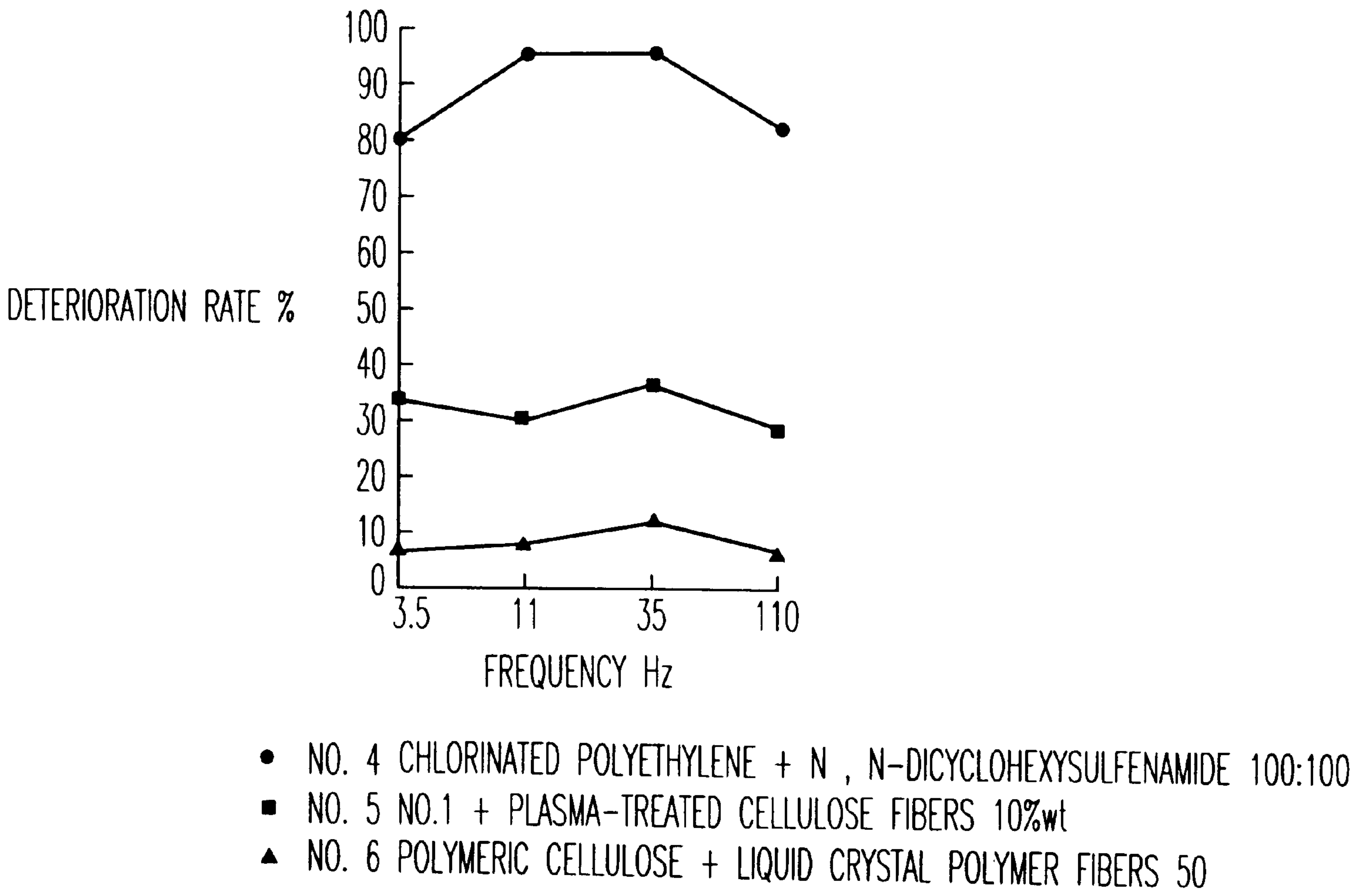
FIG. 11 is a graph showing a test result of the deterioration rate of each damping material.

In FIG. 11, No. 4 designates polyethylene chloride and N,N-dicyclohexylsulfenamide of 100:100; No. 5 designates No. 4 incorporated with 10% wt of plasma-treated cellulose fibers, and No. 6 designates polymeric cellulose and liquid crystal polymer fibers 50.

As described above, the present invention is to disperse a dielectric material in a monodomain structure in a polymer matrix to obtain a damping effect by utilizing a piezoelectric effect. The present invention does not rely on manufacturing methods. In particular, when the dielectric material is a compound having a straight chain structure used for a liquid crystal material, a sufficient damping effect can be obtained even when the dielectric material is dispersed in a molecule level.

In accordance with the present invention, it is possible to obtain a damping material having a large loss factor tan δ of 1 or more and a small strain amplitude dependence. Further, in the present invention, a strain-electric conversion effect due to the configuration anisotropy of an organic dielectric material is utilized. Accordingly, the effect of absorbing a vibrational energy is large, and it is unnecessary to conduct a polarization treatment and a process of attaching electrodes unlike the application of the ordinary piezoelectric polymer film. Accordingly, there is a large advantage in economical view. In particular, since the damping material exhibits a sufficient effect in a smaller strain region, a remarkable advantage is expected in an acoustic field.

Obviously, numerous modifications and variations of the present invention are possible in light of the above teachings. It is therefore to be understood that within the scope of the appended claims, the invention may be practiced otherwise than as specifically described herein.

What is claimed is:

1. A piezoelectric dispersion type organic damping composite comprising an organic series dielectric or ferroelectric material which is dispersed in a non-dielectric polymer.

2. The piezoelectric dispersion type organic damping composite according to claim 1, wherein the dielectric or ferroelectric material is in an acicular form.

3. The piezoelectric dispersion type organic damping composite according to claim 2, wherein the dielectric or ferroelectric material has an acicular ratio of 5 or more, and has a circular shape in cross section having a diameter of 20 μm or less, or has a rectangular shape in cross section having a side of 20 μm or less.

4. The piezoelectric dispersion type organic damping composite according to claim 1, wherein the volume ratio of the dielectric or ferroelectric material to the non-dielectric polymer is 0.3 to 0.7.

5. The piezoelectric dispersion type organic damping composite according to claim 2, wherein the volume ratio of the dielectric or ferroelectric material to the non-dielectric polymer is 0.3 to 0.7.

6. The piezoelectric dispersion type organic damping composite according to claim 3, wherein the volume ratio of the dielectric or ferroelectric material to the non-dielectric polymer is 0.3 to 0.7.

* * * * *